United States Patent
Wei

(10) Patent No.: US 11,324,118 B2
(45) Date of Patent: May 3, 2022

(54) CIRCUIT BOARD AND CONNECTOR

(71) Applicant: Tyco Electronics (Shanghai) Co. Ltd., Shanghai (CN)

(72) Inventor: Peng Wei, Middletown, PA (US)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/903,959

(22) Filed: Jun. 17, 2020

(65) Prior Publication Data
US 2020/0404786 A1   Dec. 24, 2020

(30) Foreign Application Priority Data

Jun. 21, 2019   (CN) .......................... 201910543120.9

(51) Int. Cl.
*H05K 1/11* (2006.01)
*H05K 1/18* (2006.01)
*H05K 1/02* (2006.01)
*H05K 3/40* (2006.01)

(52) U.S. Cl.
CPC ............ *H05K 1/115* (2013.01); *H05K 1/184* (2013.01); *H05K 1/024* (2013.01); *H05K 1/025* (2013.01); *H05K 1/0216* (2013.01); *H05K 1/0245* (2013.01); *H05K 1/11* (2013.01); *H05K 1/117* (2013.01); *H05K 1/18* (2013.01); *H05K 3/4007* (2013.01); *H05K 2201/09063* (2013.01)

(58) Field of Classification Search
CPC ............................... H05K 1/115; H05K 1/184
See application file for complete search history.

(56) References Cited

U.S. PATENT DOCUMENTS

| | | | | |
|---|---|---|---|---|
| 5,841,074 A | * | 11/1998 | Egan .................... | H05K 7/1458 174/250 |
| 9,455,530 B2 | * | 9/2016 | Patel .................. | H01R 13/6597 |
| 2002/0027020 A1 | * | 3/2002 | Kobayashi ........... | H05K 1/0222 174/261 |
| 2002/0084876 A1 | * | 7/2002 | Wright ................. | H05K 1/0253 333/238 |
| 2012/0142200 A1 | * | 6/2012 | Ito ....................... | H01R 13/6471 439/65 |
| 2015/0340785 A1 | * | 11/2015 | Kashiwakura ..... | H01R 13/6473 439/630 |
| 2020/0214129 A1 | * | 7/2020 | Adachi ................ | H05K 1/0281 |

\* cited by examiner

*Primary Examiner* — Ishwarbhai B Patel
(74) *Attorney, Agent, or Firm* — Barley Snyder

(57) ABSTRACT

A circuit board includes a plurality of signal contact pads each electrically contacting a contact point of one of a plurality of signal terminals and a non-conductive through hole extending through the circuit board in an interval area between a pair of adjacent signal contact pads of the plurality of signal contact pads.

13 Claims, 4 Drawing Sheets

CIRCUIT BOARD AND CONNECTOR

CROSS-REFERENCE TO RELATED APPLICATION

This application claims the benefit of the filing date under 35 U.S.C. § 119(a)-(d) of Chinese Patent Application No. 201910543120.9, filed on Jun. 21, 2019.

FIELD OF THE INVENTION

The present invention relates to a circuit board and, more particularly, to a circuit board adapted to electrically contact signal terminals.

BACKGROUND

Generally, a contact pad, which is adapted to electrically contact with a signal terminal of a connector, is formed on a circuit board. A contact point of the signal terminal elastically and electrically contacts with the contact pad on the circuit board, so that an electrical signal may be transmitted from the circuit board to the signal terminal. However, in the prior art, an impedance of a contact area between the contact pad of the circuit board and the contact point of the signal terminal is lower than an ideal impedance, which affects the transmission quality of the electrical signal.

The impedance of the contact area may be adjusted by adjusting the size of the contact pad on the circuit board and/or the contact point of the signal terminal. However, unfortunately, there are strict industry agreements for the circuit board and the connector, and generally the sizes of the contact pad on the circuit board and the contact point of the signal terminal cannot be adjusted casually. Therefore, in the prior art, the impedance of the contact area between the contact pad of the circuit board and the contact point of the signal terminal is lower than the ideal impedance, which reduces the transmission quality of the electrical signal.

FIG. 1 is an illustrative view showing electrical contact between a circuit board 10 and signal and ground terminals 21, 22 according to the prior art. As shown in FIG. 1, in the prior art, there is not formed any non-conductive through hole in the interval area between two adjacent signal contact pads 11a on the circuit board 10, and there is not formed any non-conductive through hole in the interval area between each ground contact pad 12a and the adjacent signal contact pad 11a.

SUMMARY

A circuit board includes a plurality of signal contact pads each electrically contacting a contact point of one of a plurality of signal terminals and a non-conductive through hole extending through the circuit board in an interval area between a pair of adjacent signal contact pads of the plurality of signal contact pads.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
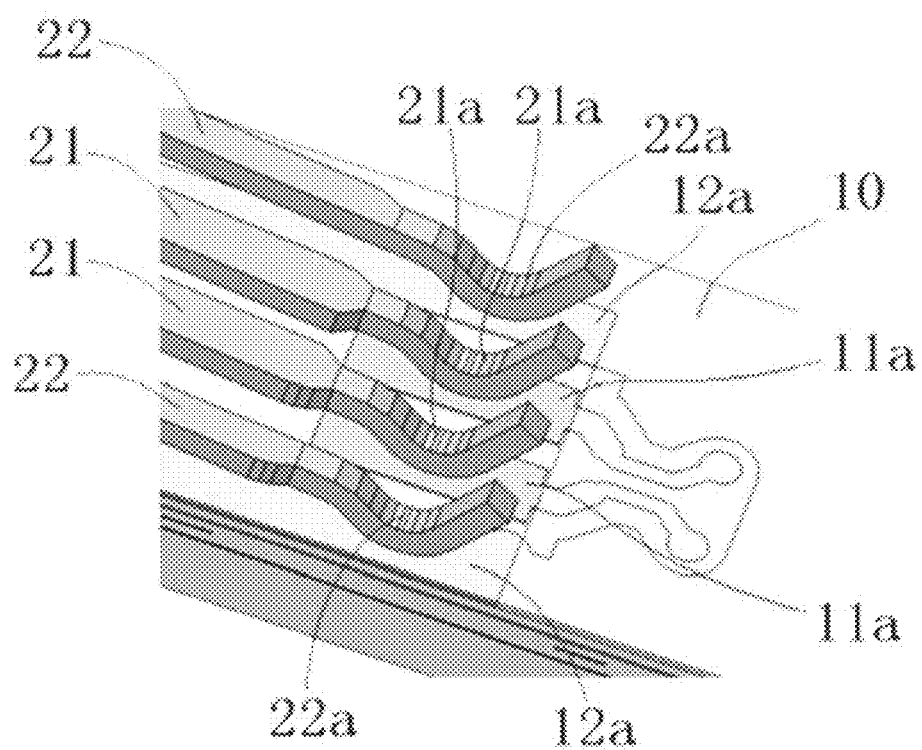
FIG. 1 is a perspective view of a circuit board electrically contacting signal terminals and ground terminals according to the prior art.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
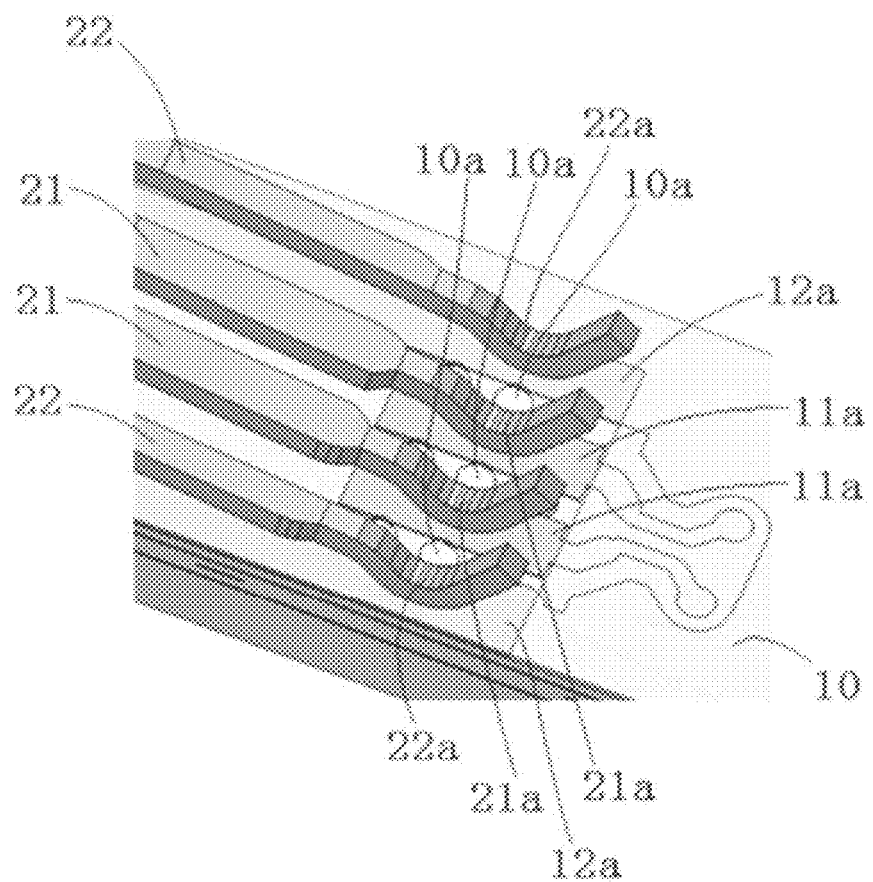
FIG. 2 is a perspective view of a circuit board electrically contacting signal terminals and ground terminals according to an embodiment of the invention.

FIG. 2 shows electrical contact between a circuit board 10 and signal and ground terminals 21, 22 according to an exemplary embodiment of the present disclosure. The circuit board 10, as shown in FIG. 2, includes a plurality of signal contact pads 11a. The plurality of signal contact pads 11a is adapted to electrically contact with contact points 21a of a plurality of signal terminals 21, respectively.

A non-conductive through hole 10a, which penetrates or extends through the circuit board 10, is formed in an interval area between two adjacent signal contact pads 11a on the circuit board 10 as shown in FIG. 2. In this way, it may enhance and improve an impedance of a contact area between the signal contact pad 11a of the circuit board 10 and the contact point 21a of the signal terminal 21. As shown in FIG. 2, in an embodiment, the plurality of signal contact pads 11a comprises differential signal contact pads arranged in pairs. The plurality of signal terminals 21 comprises differential signal terminals arranged in pairs. The differential signal terminals 21 arranged in pairs are adapted to electrically contact with the differential signal contact pads 11a arranged in pairs, respectively.

As shown in FIG. 2, in an embodiment, the circuit board 10 further comprises a plurality of ground contact pads 12a. The plurality of ground contact pads 12a are adapted to electrically contact with contact points 22a of the plurality of ground terminals 22, respectively. A non-conductive through hole 10a, which penetrates or extends through the circuit board 10, is also formed in an interval area between each ground contact pad 12a and the signal contact pad 11a adjacent to the ground contact pad 12a.

As shown in FIG. 2, in an embodiment, the plurality of signal contact pads 11a and the plurality of ground contact pads 12a are arranged in one row on the surface of the circuit board 10. However, the present disclosure is not limited to this, and the plurality of signal contact pads 11a and the plurality of ground contact pads 12a may be arranged in at least one row, for example two, three or more rows, on the surface of the circuit board 10.

As shown in FIG. 2, in an embodiment, there is provided one ground contact pad 12a at at least one of two opposite sides of each signal contact pad 11a. As shown in FIG. 2, in an embodiment, there is provided one ground contact pad 12a at each of two opposite sides of each pair of differential signal contact pads 11a.

As shown in FIG. 2, in an embodiment, the non-conductive through hole 10a is a circular non-conductive through hole 10a with a circular cross section. Referring to FIG. 2, there is formed two circular non-conductive through holes 10a in each of the interval areas. However, the present disclosure is not limited to the embodiments illustrated, for example, one, three or more circular non-conductive through holes 10a may be formed in each of the interval areas. In addition, the size of the circular non-conductive through hole 10a may be changed as required.

Figure 3:
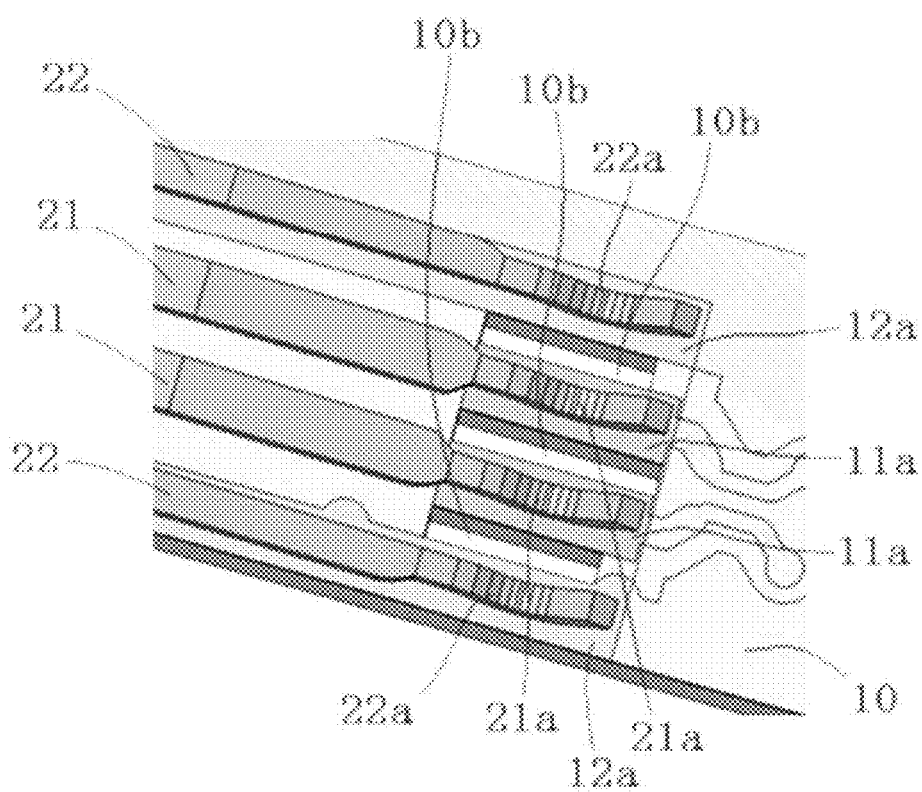
FIG. 3 is a perspective view of a circuit board electrically contacting signal terminals and ground terminals according to another embodiment of the invention.

FIG. 3 shows electrical contact between a circuit board 10 and signal and ground terminals 21, 22 according to another exemplary embodiment of the present disclosure. Like reference numbers refer to like elements and only the differences from the embodiment shown and described with reference to FIG. 2 will be described in detail herein.

As shown in FIG. 3, in an embodiment, a strip-shaped non-conductive through hole 10b with a rectangular cross section is formed in an interval area between two adjacent signal contact pads 11a and penetrates or extends through the circuit board 10. A strip-shaped non-conductive through hole 10b with a rectangular cross section is also formed in an interval area between each ground contact pad 12a and the signal contact pad 11a adjacent to the ground contact pad 12a and penetrates or extends through the circuit board 10. As shown in FIG. 3, in an embodiment, there is formed one strip shaped non-conductive through holes 10b in each of the interval areas. A length of each strip shaped non-conductive through hole 10b is equal to or slightly less than that of the signal contact pad 11a.

In an exemplary embodiment of the present disclosure, an impedance of a contact area between the circuit board 10 and the signal terminal 21 may be adjusted to be close to or equal to a preset impedance, which may be ideal or desired in practice, by adjusting at least one of the shape, size and number of the non-conductive through holes 10a, 10b. In this way, the transmission quality of the electrical signal between the circuit board 10 and the signal terminal 21 may be improved.

In another embodiment, a connector includes the circuit board 10 of the embodiment of FIG. 2 or the embodiment of FIG. 3.

Figure 4:
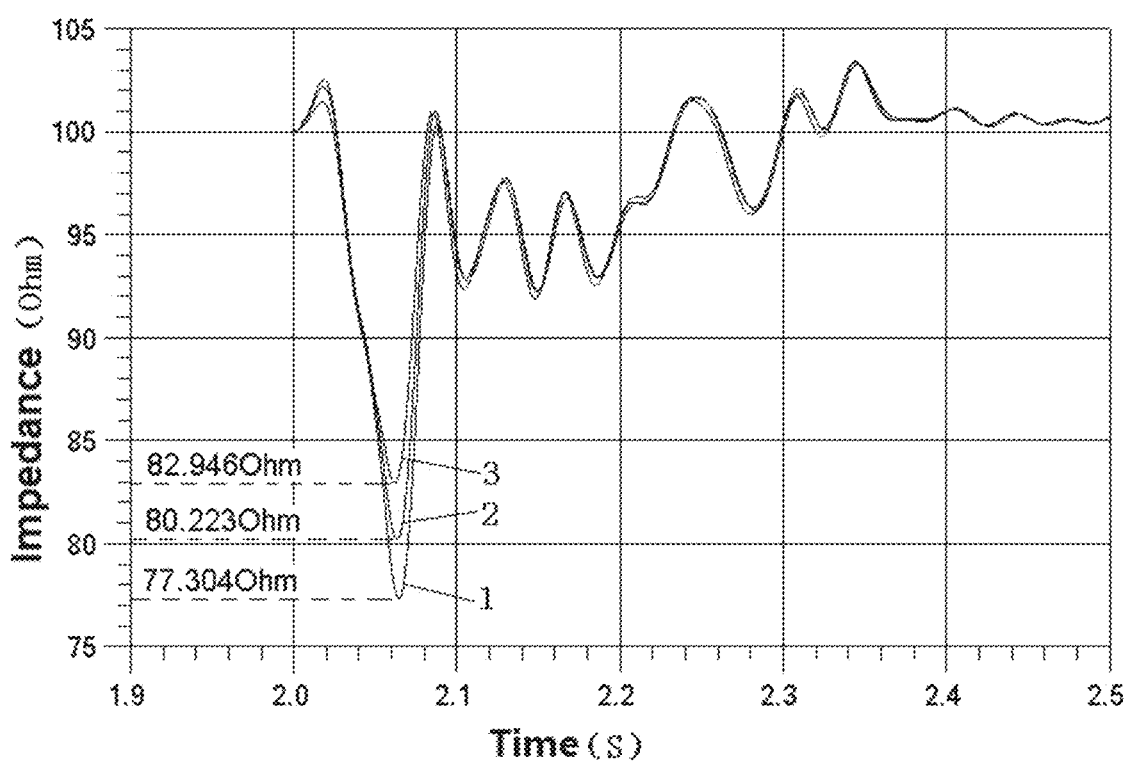
FIG. 4 is a graph of impedance change curves of electrical signals transmitted between the circuit board and the signal terminals shown in FIG. 1, FIG. 2, and FIG. 3.

FIG. 4 shows impedance change curves of the electrical signals transmitted, for example in the contact areas, between the circuit board 10 and signal terminals 21 shown in FIG. 1, FIG. 2 and FIG. 3. In FIG. 4, the curve 1 indicates the impedance change curve of the electrical signal transmitted in the contact area between circuit board 10 and the signal terminal 21 shown in FIG. 1; the curve 2 indicates the impedance change curve of the electrical signal transmitted in the contact area between circuit board 10 and the signal terminal 21 shown in FIG. 2; and the curve 3 indicates the impedance change curve of the electrical signal transmitted in the contact area between circuit board 10 and the signal terminal 21 shown in FIG. 3.

As shown in FIG. 4, in the illustrated embodiment, when the electrical signal is transmitted in the contact area between the circuit board 10 and the signal terminal 21 shown in FIG. 1, the impedance for the electrical signal is about 77.304 Ohm; when the electrical signal is transmitted in the contact area between the circuit board 10 and the signal terminal 21 shown in FIG. 2, the impedance for the electrical signal is about 80.223 Ohm; when the electrical signal is transmitted in the contact area between the circuit board 10 and the signal terminal 21 shown in FIG. 3, the impedance for the electrical signal is approximately 82.946 Ohm.

Therefore, according to FIG. 4, it may be clearly seen that the impedance of the contact area between the contact pad 11a of the circuit board 10 and the contact point 21a of the signal terminal 21 may be greatly improved by forming a non-conductive through hole 10a, which penetrates or extends through the circuit board 10, in the interval area between the two adjacent signal contact pads 11a and/or between the ground contact pad 12a and the adjacent signal contact pad 11a. In this way, the transmission quality of the electrical signal between the circuit board 10 and the signal terminal 21 may be greatly improved.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle. Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A circuit board, comprising:
   a plurality of signal contact pads formed over a first surface of the circuit board with each electrically contacting a contact point of one of a plurality of signal terminals; and
   a plurality of non-conductive through holes extending through the circuit board in an interval area directly between a pair of adjacent signal contact pads of the plurality of signal contact pads, only one of the non-conductive through holes being directly aligned with each of the contact points of adjacent signal terminals in a direction transverse to a longitudinal direction of the signal contact pad.

2. The circuit board of claim 1, further comprising a plurality of ground contact pads formed over a first surface of the circuit board with each electrically contacting a contact point of one of a plurality of ground terminals.

3. The circuit board of claim 2, wherein each of the plurality of non-conductive through holes extends through the circuit board in an interval area between one of the plurality of ground contact pads and one of the plurality of signal contact pads adjacent to the one of the plurality of ground contact pads.

4. The circuit board of claim 3, wherein the plurality of signal contact pads and the plurality of ground contact pads are arranged in at least one row on a surface of the circuit board.

5. The circuit board of claim 4, wherein one of the plurality of ground contacts pads is disposed at at least one of a pair of opposite sides of each of the plurality of signal contact pads.

6. The circuit board of claim 4, wherein the plurality of signal contact pads are a plurality of differential signal contacts pads arranged in pairs and the plurality of signal terminals are a plurality of differential signal terminals arranged in pairs, the differential signal terminals electrically contact the differential signal contact pads.

7. The circuit board of claim 6, wherein one of the plurality of ground contact pads is disposed at each of a pair of opposite sides of each pair of differential signal contact pads.

8. The circuit board of claim 2, wherein the non-conductive through hole is a circular non-conductive through hole with a circular cross section.

9. The circuit board of claim 8, wherein a pair of circular non-conductive through holes extend through the circuit board in the interval area.

10. The circuit board of claim 1, wherein the plurality of non-conductive through holes are circular non-conductive through holes with a circular cross section.

11. The circuit board of claim 10, wherein a pair of circular non-conductive through holes extend through the circuit board in the interval area.

12. The circuit board of claim 1, wherein an impedance of a contact area between the circuit board and each of the signal terminals is adjusted to be equal to a preset impedance by adjusting at least one of a shape, a size, and a number of the non-conductive through hole.

13. A circuit board, comprising:
- a plurality of signal contact pads formed in a longitudinal direction over a first surface of the circuit board with each electrically contacting a contact point of one of a plurality of signal terminals;
- a plurality of ground contact pads formed in the longitudinal direction over the first surface of the circuit board with each electrically contacting a contact point of one of a plurality of ground terminals, one of the plurality of ground contacts pads is disposed on each of a pair of opposite sides of each of the plurality of signal contact pads;
- a first pair of non-conductive circular through holes extending through the circuit board in an interval area directly between a pair of adjacent signal contact pads of the plurality of signal contact pads, the pair of non-conductive circular through holes spaced from one another in the longitudinal direction of the adjacent signal contact pads;
- a second pair of non-conductive circular through holes extending through the circuit board in an interval area directly between one of the plurality of ground contact pads and an adjacent one of the plurality of signal contact pads, the pair of non-conductive circular through holes spaced from one another in the longitudinal direction of the adjacent signal and ground contact pads; and
- a third pair of non-conductive circular through holes extending through the circuit board in an interval area directly between the other one of the plurality of ground contact pads and an adjacent one of the plurality of signal contact pads, the pair of non-conductive circular through holes spaced from one another in the longitudinal direction of the adjacent signal and ground contact pads,
- wherein only one of each of the first, second and third pairs of non-conductive circular through holes is directly aligned with each of the contact points of the signal and ground terminals on each of the signal and ground contact pads in a direction transverse to the longitudinal direction of the signal and ground contact pads.

* * * * *